United States Patent
Park et al.

(10) Patent No.: US 8,687,752 B2
(45) Date of Patent: Apr. 1, 2014

(54) METHOD AND APPARATUS FOR RECEIVER ADAPTIVE PHASE CLOCKED LOW POWER SERIAL LINK

(75) Inventors: Dongmin Park, San Diego, CA (US); Jafar Savoj, San Diego, CA (US); Beomsup Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 129 days.

(21) Appl. No.: 13/286,350

(22) Filed: Nov. 1, 2011

(65) Prior Publication Data

US 2013/0107987 A1 May 2, 2013

(51) Int. Cl.
*H04L 7/00* (2006.01)
(52) U.S. Cl.
USPC .......................................... 375/355; 375/354
(58) Field of Classification Search
USPC ......... 375/219–222, 354–355, 226, 232, 294, 375/371, 372, 373, 375, 376
See application file for complete search history.

(56) References Cited

U.S. PATENT DOCUMENTS

| | | | | |
|---|---|---|---|---|
| 7,003,066 B1 * | 2/2006 | Davies et al. | ................. | 375/376 |
| 7,102,446 B1 * | 9/2006 | Lee et al. | ......................... | 331/11 |
| 7,301,996 B1 * | 11/2007 | Chi et al. | ....................... | 375/226 |
| 7,466,787 B1 * | 12/2008 | Ross | .............................. | 375/376 |
| 7,672,406 B2 * | 3/2010 | Takeuchi | ....................... | 375/345 |
| 8,225,017 B1 * | 7/2012 | Tang et al. | ...................... | 710/71 |
| 2003/0165201 A1 * | 9/2003 | Shahar et al. | ................. | 375/316 |
| 2004/0210790 A1 * | 10/2004 | Moon et al. | ................... | 713/500 |
| 2005/0135527 A1 * | 6/2005 | Masui et al. | .................. | 375/355 |
| 2005/0157781 A1 * | 7/2005 | Ho et al. | ........................ | 375/233 |
| 2005/0286643 A1 * | 12/2005 | Ozawa et al. | ................. | 375/242 |
| 2006/0088137 A1 * | 4/2006 | Jiang et al. | .................... | 375/371 |
| 2006/0126993 A1 * | 6/2006 | Piede et al. | ..................... | 385/14 |
| 2006/0176934 A1 * | 8/2006 | Riedel et al. | ................. | 375/130 |
| 2007/0047680 A1 * | 3/2007 | Okamura | ..................... | 375/348 |
| 2007/0047683 A1 | 3/2007 | Okamura et al. | | |
| 2007/0098112 A1 * | 5/2007 | Kim et al. | ..................... | 375/312 |
| 2007/0160173 A1 * | 7/2007 | Takeuchi | ...................... | 375/355 |
| 2007/0177700 A1 | 8/2007 | Saeki | | |
| 2007/0201541 A1 * | 8/2007 | Chuang et al. | ................ | 375/221 |

(Continued)

FOREIGN PATENT DOCUMENTS

EP    1780930 A2    5/2007

OTHER PUBLICATIONS

Partial International Search Report—PCT/US2012/063089—ISA/EPO—Feb. 25, 2013.

(Continued)

*Primary Examiner* — Emmanuel Bayard
(74) *Attorney, Agent, or Firm* — Sam Talpalatsky; Nicholas J. Pauley; Joseph Agusta (57) ABSTRACT

A serial bit stream having a given bit per second rate is received and distributed to a plurality of phase shifted samplers. A multi-phase sampling trigger is generated at a rate lower than the given bit per second rate, and each of the phase shifted samplers is controlled by one of the phases of the multi-phase sampling trigger. The time spacing between phases of the multi-phase sampling trigger is the inverse of the given bit per second rate. The phase of the multi-phase sampling trigger is aligned with the phase of the serial bit, to collectively recover by the plurality of phase shifted samplers a plurality of consecutive bits from the serial bit stream.

21 Claims, 6 Drawing Sheets

(56) References Cited

U.S. PATENT DOCUMENTS

| | | |
|---|---|---|
| 2008/0024178 A1 | 1/2008 | Kim et al. |
| 2008/0175310 A1* | 7/2008 | Okamura et al. ............. 375/232 |
| 2009/0232250 A1* | 9/2009 | Yamada et al. ............... 375/295 |
| 2011/0064176 A1 | 3/2011 | Takada |
| 2012/0169403 A1* | 7/2012 | Gupta et al. .................. 327/530 |
| 2012/0182480 A1* | 7/2012 | Chi ............................... 348/723 |
| 2013/0183031 A1* | 7/2013 | Abe ............................... 398/25 |

OTHER PUBLICATIONS

International Search Report and Written Opinion—PCT/US2012/063089—ISA/EPO—Jul. 11, 2013.

* cited by examiner

METHOD AND APPARATUS FOR RECEIVER ADAPTIVE PHASE CLOCKED LOW POWER SERIAL LINK

FIELD OF DISCLOSURE

The present disclosure relates to hardwire bus communications and, more particularly, to parallel-to-serial communication.

BACKGROUND

Communication of multi-bit data from a source to a receiver may be performed by converting the multi-bit data into a serial bit stream, transmitting the serial bit stream to the receiver, and then at the receiver converting the serial bit stream back into multi-bit data. Reasons for communicating multi-bit data as a serial bit stream, as opposed to transmitting its multiple bits concurrently over a multi-line bus, include limitations on bus width.

Converting an N-bit multi-bit data into a serial bit stream typically begins by clocking all N-bits together, broadside, into a parallel-in-serial-out shift register and then applying N clocks of a serializer clock SCK to shift the N-bits out through a serial output as N consecutive bits. If the N-bit data rate is substantially continuous at FS N-bit words per second, then the rate of the serial bit stream, in bits per second (BPS) must equal N multiplied by FS. The serializer clock SCK frequency must therefore be the same as that BPS.

In conventional serial bit stream communications the receiver must either receive the serializer clock SCK with the bit stream or locally generate the same SCK used. By the serializer/transmitter, frequency and phase locked to the bit stream, Local generation of the SCK requires the receiver have substantially the same high speed clock generating capability as the serializer/transmitter and, in certain applications, this may be less than optimal. Such applications may therefore require the serializer/transmitter transmit the serializer clock SCK to the receiver. There are two means to perform the transmission. The first is to embed SCK in the serial bit stream signal, from which the receiver may recover SCK. However, for reasons known to persons of ordinary skill in the art, in certain applications communication using an embedded clock signal may be not optimal. The second means for communicating SCK from the serializer/transmitter to the receiver is by a separate transmission line.

Figure 1:
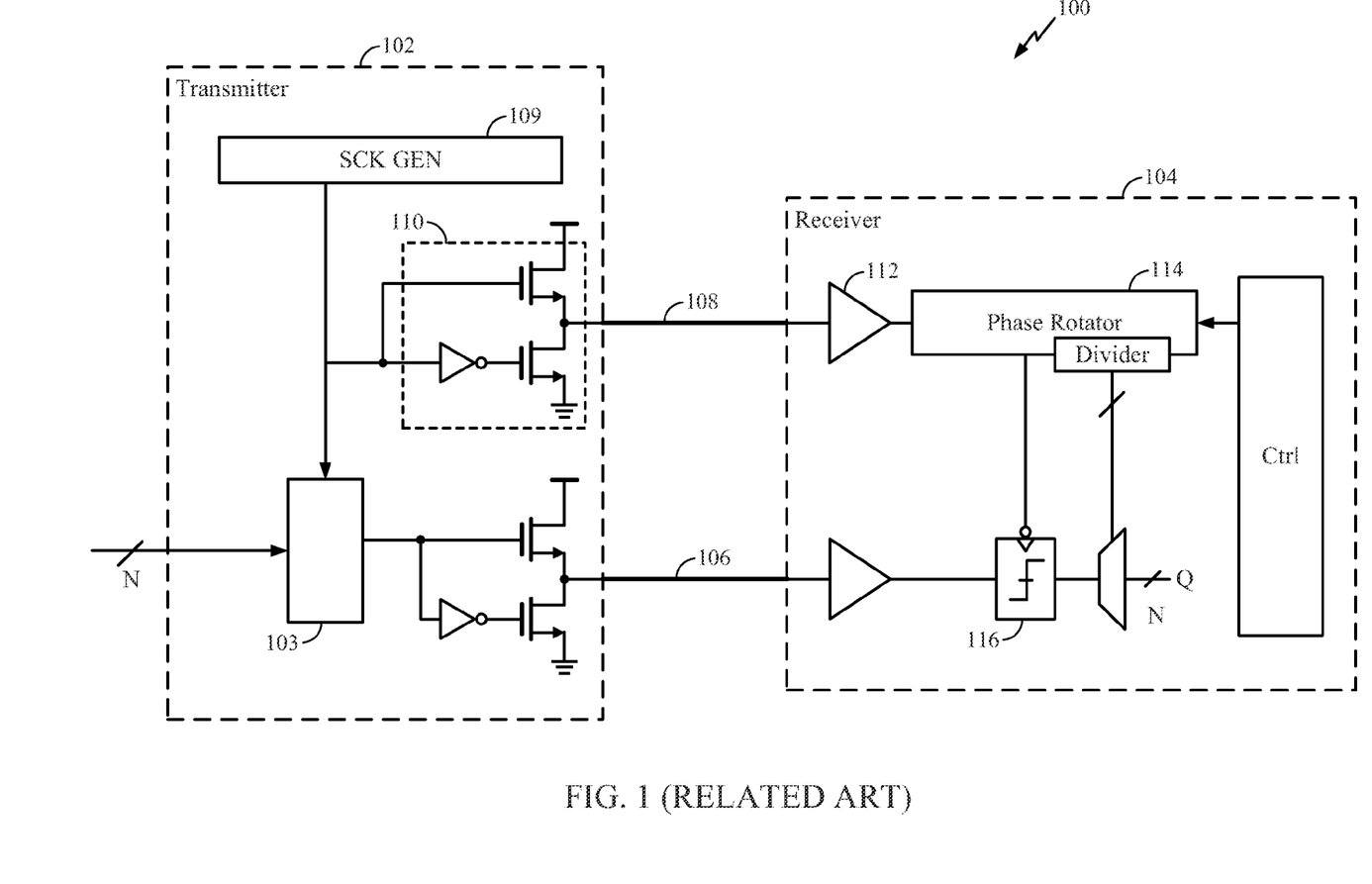
FIG. 1 illustrates an example conventional system for serialization, communication, and recovery of N-bit data.

The related art FIG. 1 shows such a conventional separate clock line communication system 100. The communication system 100 includes a conventional serializer/transmitter 102 having n serializer 103 for converting multi-bit data to a serial bit stream, a conventional receiver 104, and two lines extending from the former to the latter, one being a serial bit transmission line 106, the other being the separate SCK, clock transmission line 108 for the serializer SCK generated by the SCK generator 109. In addition, the conventional serializer/transmitter 102 includes a clock line driver 110, and the conventional receiver 104 includes a clock receiving buffer 112. In operation the conventional serializer/transmitter 102 clock line driver 110 drives the clock transmission line 108 with SCK, the conventional receiver 104 receives the transmitted SCK, adjusts the phase through a phase rotator 114 to obtain optimal sampling, and uses it to clock the phase shifted sampler 116.

Such conventional means as depicted by the related art FIG. 1 for serializing N-bit data into a bit stream, communicating the bit stream and the serializing clock, recovering the serial bits and re-converting these recovered serial bits to parallel N-bit data, has various shortcomings One example shortcoming is the power required for its serializer/transmitter 102 to forward the serializing clock to the receiver 104. The total of this power consumed in forwarding SCK signal includes the power draw of the clock line driver (e.g., 110) within the serializer/transmitter 102 and the power draw of the clock receiving buffer (e.g., 112) in the receiver 104.

SUMMARY

Exemplary embodiments of the invention are directed to systems and methods for receiving and sampling a serial bit stream to recover the bits without receiving the serializing clock.

One embodiment provides a method for recovering bits from a serial bit stream signal having a given bit rate, and may include receiving the serial bit stream signal concurrently at R different phase shifted samplers. Where R is at least two, triggering the R phase shifted samplers, one at a time, each at a corresponding one sampling time from among R consecutive sampling times spaced according to the inverse of the bit rate, to obtain at R phase shifted samplers a block of R consecutive bits of the serial bit stream signal.

In one aspect the serial bit stream signal may carry N-bit data, and the method may further include repeating the latching of the R phase shifted samplers and, at each repeat, recovering another block of R bits of the N-bits, until N parallel bits are obtained.

In one aspect the serial bit stream signal may comprise bits of a first signal and a second signal, in an alternating sequence, and the triggering of the R phase shifted samplers may obtain at a first plurality of the R phase shifted samplers a block of a first plurality of consecutive bits of the first signal, and may obtain at a second plurality of the R phase shifted samplers a block of a second plurality of consecutive bits of the second signal.

In one related aspect, the consecutive sampling times alternate in sequence between even sampling times and odd sampling times, and each of the first plurality of the R phase shifted samplers may be triggered at a corresponding one of the even sampling times and each of the second plurality of the R phase shifted samplers may be triggered at a corresponding one of the odd sampling times.

Methods according to one embodiment, in one aspect, may further include comprising generating an R-phase sampling trigger, wherein each phase may correspond to one of the sampling times. In one further aspect, methods according to one embodiment may include detecting a phase difference between the R-phase sampling trigger and the serial bit stream signal, and generating an R-phase sampling trigger may include adjusting a phase of the R-phase sampling trigger relative to the serial bit stream signal, based on a result of detecting a phase difference.

One example apparatus for receiving a serial bit stream according to one exemplary embodiment may include means for receiving a serial bit stream signal having a bit rate of SBPS bits per second, means for generating a local clock having a frequency less than SBPS, means for generating R clock phases of the local clock, the R clock phases being separated in time by an interval 1/FB, and means for triggering R phase shifted samplers, each having an input coupled to the signal input, with a corresponding one of the R clock phases.

In one aspect, each triggering of the R phase shifted samplers captures the serial bit stream signal at the edge of its respective clock phase, to produce a corresponding set of R consecutive samples of the serial hit stream signal, spaced in time by 1/SBPS. In another aspect, an apparatus according to one exemplary embodiment may include means for detecting a phase difference between a preceding sequence of R phase delayed sampling edges and the serial bit stream signal. In one related aspect, a means for generating an R-phase sampling trigger may include means for generating M phases of the local clock, where M is at least an integer multiple of R, having M candidate phases, means for selecting the R phases from among the M phases, and means for adjusting a phase of the R-phase sampling trigger relative to the serial bit stream signal, based on a result of detecting a phase difference.

According to one exemplary embodiment, one apparatus for recovering bits from a serial bit stream signal having a given bit rate may include R different phase shifted samplers for concurrently receiving the serial bit stream signal, and means for triggering the R phase shifted samplers, one at a time, at sampling times spaced according to the inverse of the bit rate, to obtain at R phase shifted samplers a block of R consecutive bits of the serial bit stream signal.

According to another exemplary embodiment, one apparatus for recovering bits from a serial bit stream signal having a given bit rate may include a serial bit stream receiver having an input and an output, a plurality of R different phase shifted samplers, each having a signal input coupled to the output of the serial bit stream receiver, and each having a triggering input, and an R-phase sampling trigger generator, having R phase taps each outputting a corresponding one of R equally spaced triggering phases, and each tap coupled to a corresponding one of the R phase shifted samplers.

BRIEF DESCRIPTION OF THE DRAWINGS

The accompanying drawings are presented to aid in the description of embodiments of the invention and are provided solely for illustration of the embodiments and not limitation thereof.

Related art

FIG, 2 is a simplified functional block diagram of one example system for serial communication of N-bit data according to one or more exemplary embodiments.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described, in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to he within the scope of the claimed subject matter. In addition, for each of the embodiments described herein, the corresponding form of any such embodiments may be described herein as, for example, "logic configured to" perform the described action.

In a communication system according to various exemplary embodiments a serializer/transmitter serializes, using a serializing clock SCK, multi-bit data into a serial bit stream SD having a given BPS of SBPS and transmits SD to a receiver/data recovery processing resource. According to various exemplary embodiments the receiver/data recovery processing resource is configured and arranged to perform recovery of the bits from the received SD without receiving the SCK. In one or more aspects the receiver/data recovery processing resource may be configured and arranged with a plurality of R phase shifted samplers, and means to trigger the R phase shifted samplers using a multi-phase trigger. Further to this aspect the receiver/data recovery processing resource may include means to trigger the multi-phase trigger at a substantially lower frequency than SBPS or SCK, in one aspect at a rate of SBPS/R or SCK/R, and to collectively capture at each triggering a block of R consecutive bits of SD. In one farther aspect, the receiver/data recovery processing resource may be configured and arranged to convert the blocks of R consecutive bits back to the N-bit data.

As will be appreciated from this disclosure, communication systems according to the exemplary embodiments obviate the SCK forwarding required by conventional serializing communication systems as depicted by the related art FIG. 1. Among other benefits obtained by obviating the SCK forwarding, is the immediate obviating of the SCK clock transmission line extending to the receiver, as well as the SCK clock receiving buffer in the receiver, both which are required by the related art FIG. 1 serializing communication system 100. As will be readily appreciated by persons of ordinary skill in the art, removal of these components and their associated overhead provides, among other benefits, removal of their respective power consumptions.

Figure 2:
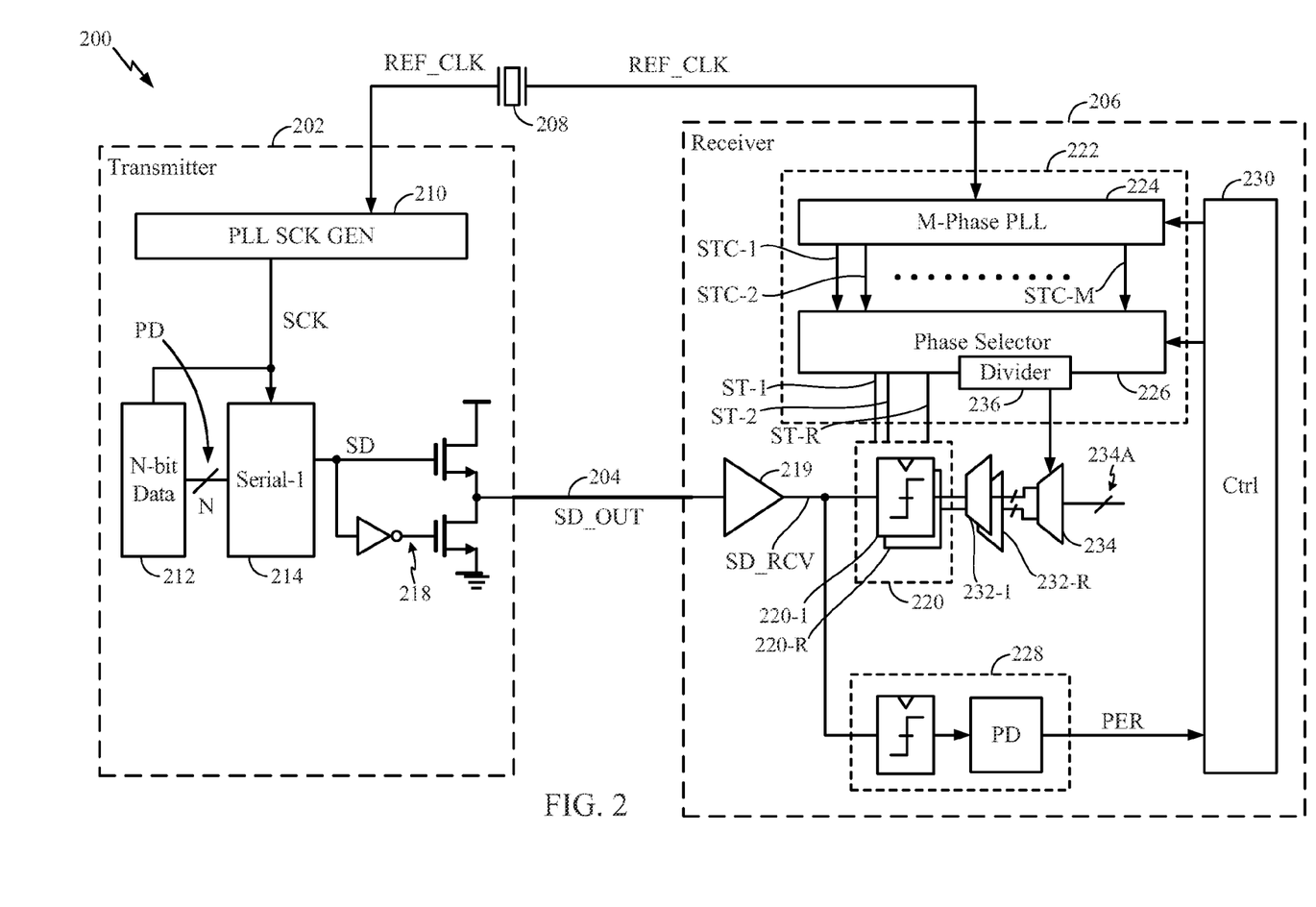

FIG. 2 is a functional block diagram of one phase sampling communication system 200 according to one or more exemplary embodiments. The FIG. 2 phase sampling communication system 200 may include a serializer/transmitter unit 202 feeding, a serial bit line 204 coupled to a receiver/data recovery unit 206. A reference clock generator 208 provides a reference clock REF_CLK having a frequency of REF_FQ. The frequency REF_FQ may be an integer sub-multiple of, and significantly lower than, the specified bit per second (SBPS) bit rate of the serial bit stream to be carried by the serial bit line 204. The serializer/transmitter unit 202 may include a phase-locked loop (PLL) 210 that, based on the REF_CLK, generates a serializer clock SCK. In one aspect the frequency of SCK may be SBPS.

It will be understood that a serializer/transmitter according to the serializer/transmitter unit 202 may be configured to serialize two multi-bit data flows, one by a rising edge of SCK and one by the falling edge of SCK, and transmit the two serial bit streams as one, e,g., by time division multiplexing. The actual SBPS of such a combined serial bit stream would be 2*SCK. Therefore, to avoid having to repeat qualifying statements in later description regarding the rate of SCK relative to SBPS, it will be understood that the "rate of SCK" or the "frequency of SCK" means the rate or frequency of SCK events used as a clock. For example, if both the rising and falling edge of SCK are used in an operation, then the "rate of SCK" or the "frequency of SCK" may mean two times the cycle rate of SCK.

Referring still to FIG. 2, the serializer/transmitter unit 202 may receive a flow PD of parallel bit N-bit words, or may include a data source 212 of the flow PD of N-bit words, at a rate of FS_PD words per second. The data source 212 may, for example, be an N-bit ADC. The flow PD is fed broadside to serializer unit 214 configured to convert the flow PD into a serial bit stream SD having at a bit rate of SBPS bits per second. With respect to specific structure of the serializer unit 214 such structure may, according to one aspect, be in accordance with a conventional serializer structure and therefore, for that one aspect, further detailed description is omitted. Alternative structures will he described in reference to FIGS. 5 and 6, at later sections of this disclosure.

With continuing reference to FIG. 2, a line driver or buffer 218 may receive SD and output it as SD_OUT to the serial bit line 204. The SD_OUT signal is received as SD_RCV by a receiving buffer 219 of the receiver/data recovery unit 206. The receiving buffer 219, in turn, distributes SD_RCV concurrently to each signal input (shown by not separately numbered) of a bank 220 of R phase shifted samplers 220-1 . . . 220-R, generically referenced as 220-$j$, Each phase shifted sampler 220-$j$ is configured. to latch and maintain on its output (shown but not separately numbered), in response to a given phase it receives at its trigger input (shown but not separately numbered) from an R-phase trigger signal, a sample of the SD_RCV. In one aspect, each phase shifted sampler 220-$j$ may include a binary threshold comparator or equivalent function to generate its sampled output as a binary value, corresponding to one of "0" or "1." For consistent reference of timings in describing example processes according to the exemplary embodiments, the phase shifted samplers 220-$j$ are assumed as rising edge triggered. Persons of ordinary skill in the art, though, can readily adapt this disclosure to phase shifted samplers 220-$j$ that are other than rising edge triggered. With respect to specific structure, it will be understood that individual phase shifted samplers 220-$j$ may be implemented in accordance with conventional binary output, clocked, sample-and-hold circuits.

Referring still to FIG. 2, according to one aspect the phase shifted samplers 220-$j$ are controlled by a separate clock phase from a set of R clock phases, for example equally spaced trigger phases from an R-phase sampling trigger generator 222, to sample SD_RCV at a set of R consecutive sampling instants, or sampling times, equally spaced in time by T, which is 1/SBPS, the bit period of SC_RCV. Further to this aspect, the R-phase sampling trigger generator 222 may include a phase adjustment means, as described in greater detail at later sections, to maintain the set of R equally spaced trigger phases, and thus the R equally spaced, consecutive sampling instants, optimally within the bit intervals (each T wide) of SD_RCV. As will also be described, the arrangement of R phase shifted samplers 220-$j$ thereby collectively captures, in response to each successive set of R trigger phases from the R-phase sampling trigger generator 222, a block of R consecutive bits from SD_RCV.

In one aspect, the phase adjustment means of the R-phase sampling trigger generator 222 may include an M-phase signal generator, for example an M-phase PLL 224, that generates, based on a local clock that may be REF_CLK, an M-phase signal or M-phase clock STC. The M phases of each cycle of STC may be M candidate phases, STC-1, STC-2 . . . STC-M, generically "STC-k" from which an R-phase sampling trigger may be selected, with M being an integer multiple of R, as will be described in greater detail below. The M-phase PLL 224 may, for example be embodied as an M/2 stage differential ring oscillator PLL, arranged to oscillate at STC_FQ, having M taps (not explicitly shown) coupled to M/2 differential voltages (not explicitly shown). The specific circuitry of the M-phase PLL 224 is not necessarily specific to the embodiments and, therefore, the M-phase PLL 224 may be in accordance with conventional multistage differential ring oscillator structures. The M candidate phases STC-k are preferably equally spaced around the STC cycle, i.e., 2pie/M radians apart.

It will be understood that since M is an integer multiple of R, there exists within the M candidate phases STC-k a quantity M/R of candidate sets of R equally spaced phases, from which a set R of equally spaced trigger phases may be selected to control the bank 220 of R phase shifted samplers. Each of these M/R candidate sets of R equally spaced phases is staggered (either advanced or delayed) incrementally by 2pie/M radians or T/M seconds relative to its nearest neighboring set. Upon selection of one of the M/R candidate sets of R phases, the selected set becomes the R-phase sampling trigger ST, the phases individually referenced ST-1, ST-2 . . . ST-R and generically as ST-$j$. Each ST-$j$ controls a corresponding one of the phase shifted samplers 220-$j$.

Referring still to FIG. 2, in one aspect phase adjustment may include a phase selector 226 controlled to select a particular one of the M/R candidate phases of SIC as the R-phase sampling trigger ST, each phase ST-1, ST-2 . . . ST-R controlling a respective one of the R phase shifted samplers 220-$j$, namely 220-1 . . . 220-R, respectively. In one aspect a phase error detector 228, which may be fed a given reference phase of the M candidate phases of STC, detects a phase difference between an R-phase sampling trigger ST and the bit boundaries within SD_RCV to generate a phase error signal PER. Further to this one aspect a controller 230, based on PER from the phase error detector 228, controls the phase selector 226 to select, as the R-phase sampling trigger ST, the R equally spaced phases among the M candidate phases SIC that best align within the bit intervals of SD_RCV, e.g., providing the optimum signal-to-noise ratio and, therefore, lowest bit error rate (BER).

As will be appreciated by persons of ordinary skill in the art, each R-phase sampling trigger ST, having its R phases aligned in phase with SD_RCV as previously described, causes the R phase shifted samplers 220-*j* to collectively capture another block of R consecutive bits of SD_RCV. Referring still to FIG. 2, in one aspect each of the R phase shifted samplers 220-*j* may feed a corresponding latch 232-*j*. More particularly, phase shifted sampler 220-1 may feed a latch 232-1, continuing to phase shifted sampler 220-R feeding latch 232-R. Each of the latches 232-*j* may be clocked by the same rising edge that triggers its corresponding phase shifted sampler 220-*j*. For example, sampling phase ST-1 may cause the first phase shifted sampler 220-1 to capture anew bit value of SD_RCV and also cause the latch 232-1 to latch the previously captured bit value SD_RCB from that phase shifted sampler 220-1. Therefore, each successive cycle of the R-phase sampling trigger ST, through its phases ST-1 . . . ST-R, causes the latches 232-1 . . . 232-R to latch sequentially, one after the other, another bit of the block of R consecutive bits from SD_RCV that their corresponding phase shifted samplers 220-1 . . . 220-R captured by the previous cycle of ST.

Referring still to FIG. 2, in one aspect the above-described sequential latching by the latches 232-1 . . . 232-R may be employed to sequentially feed an N-bit serial-in-parallel-out register 234. More particularly, according to this one aspect each successive cycle of the R-phase sampling trigger ST, namely phases ST-1 . . . ST-R, causes another block of R bits from SD_RCV to be sequentially clocked into the serial-in port (shown but not separately numbered) of the N-bit serial-in-parallel-out register 234. Still further, the parallel-out port 234A of the N-bit serial-in-parallel-out register 234 may be clocked by a divide by N/R divider 236 that in turn, is clocked once every STC clock cycle. The N/R divider may be included in the R-phase sampling trigger generator 222. As readily understood, since each STC cycle causes the latches 232-1 . . . 232-R to clock another R bits into the N-bit serial-in-parallel-out register 234, after N/R cycles of STC, another N-bit word may be clocked out With respect to alignment of the N/R divider 236 with the N-bit word boundaries, various means will become apparent to persons of ordinary skill in the art from this disclosure, It will be understood that the exemplary embodiments may be practiced with a wide range of values for M, R, REF_FQ and SBPS. Relevant relationships among the values are readily understood by persons or ordinary skill in the art from this disclosure Further, such persons will be enabled, from this disclosure in combination with the general engineering methods and know-how such persons possess, to select values for these parameters to meet application-specific requirements.

To illustrate various concepts, one arbitrary set of example values for M and R of M=16 and R=4 will be selected. It will also be assumed, for this example, that the M-phase PLL 224 is formed as a ring oscillator PLL having four taps. The specific value of SBPS, and hence frequency of SCK is not relevant, but as can be understood the M-phase PLL 224 will oscillate at an STC_FQ of SCK/4. It will be understood that these example values for M and R are only for purposes of describing various concepts without unnecessary complexities, and are not intended as limiting the scope of practices according to or within any embodiment. Example processes of phase adjustment, as may be performed by the phase selector 226, controlled by the controller 230 based on the phase error signal PER from the phase error detector 228, and using these arbitrary set of values for M and R, will be described.

In one example process to adjust the phase of the sampling, starting at an arbitrary phase T0 in each cycle of STC the following may be generated by the M-phase PLL 224: a first of its M taps (not shown) outputs a candidate phase STC-1, and 2pie/16 radians or T/16 seconds later, a second of its M taps (not shown) outputs a candidate phase STC-2, and this continues at subsequent taps of the M taps every 2pie/16 radians or T/16 seconds until the 16$^{th}$ tap outputs a candidate phase STC-16 (corresponds to STC-M on FIG. 2). The 16 consecutive candidate phases of STC, spaced 2pie/16 radians or T/16 seconds apart, provide 4 of the R phase sample triggers ST, with all 4 of the phases spaced equally by 2pie/R. More particularly, in this example the first selection for the 4-phase ST may be the STC candidate phases at 0, 90, 180, and 270 degrees; the second selection for the 4-phase ST may be the STC candidate phases at 22.5, 112.5, 202.5, and 292.5 degrees; the third selection may be the STC candidate phases at 45, 135, 225, and 315 degrees, and the fourth selection for the 4-phase ST may the STC candidate phases at 67,5, 157.5, 247.5 and 337,5 degrees.

Continuing with the above-described example. In one illustrative phase adjustment process an initial state of the phase selector 226 may select the first 4-phase ST, meaning the STC candidate phases at 0, 90, 180, and 270 degrees. Accordingly, first phase shifted sampler 220-1 samples SD_RCV at 0 degrees (or T0); second phase shifted sampler 220-2 samples SD_RCV at 90 degrees (or T0+T); third phase shifted sampler 220-3 samples SD_RCV at 180 degrees (or T0+2T); and fourth phase shifted sampler 220-4 samples SD_RCV at 270 degrees (or T0+3T). If this timing of the first 4-phase sampling trigger ST is not acceptably aligned with the current SD_RCV the phase error detector 228 detects an unacceptable error. In response, the controller 230 may cause the phase selector 226 to pick the second selection for the 4-phase sampling trigger ST. This will change the triggering of the phase shifted samplers 220 such that the first phase shifted sampler 220-1 samples SD_RCV at 22.5 degrees; the second phase shifted sampler 220-2 samples SD_RCV at 112.5 degrees; the third phase shifted sampler 220-3 samples SD_RCV at 202.5 degrees; and the fourth phase shifted sampler 220-4 samples SD_RCV at 292.5 degrees.

The above-described example process may continue in an iterative manner until an acceptable phase error (e.g., phase error signal PER) is detected by the phase error detector 228, or another given termination condition is met. For example, if an acceptable phase error cannot be maintained the controller 230 may generate a notifying signal. It will also be understood that the controller 230 may continue to monitor the phase error detector 228 and, upon detection of unacceptable phase error, may control the phase selector 226 to select another of the M candidate phases of STC.

As previously described, in addition to a wide range for M and R the exemplary embodiments contemplate applications to a wide range of SBPS, and hence example frequencies of SCK, as well as example frequencies of REF_CLK. As one illustration, referenced to the above-described example values of M=16 and R=4, the contemplated ranges of such value may extend over and include an SCK of 980 MHz, an example bit rate of 980 Mhps (or 1.92 Gbps with a transmitter/serializer 202 utilizing the rising and falling edges of SCK); and an example frequency REF_FQ of 19.2 MHz. As will be understood from this disclosure, this example set of values for SCK, REF_FQ, M and R, shows a frequency for STC of SCK/R=960 Mbps/4=235 MHz, or 1.92 Gbps/4=470 MHz if the rising and falling edges of SCK are used by the transmitter/serializer unit 202.

Figure 3:
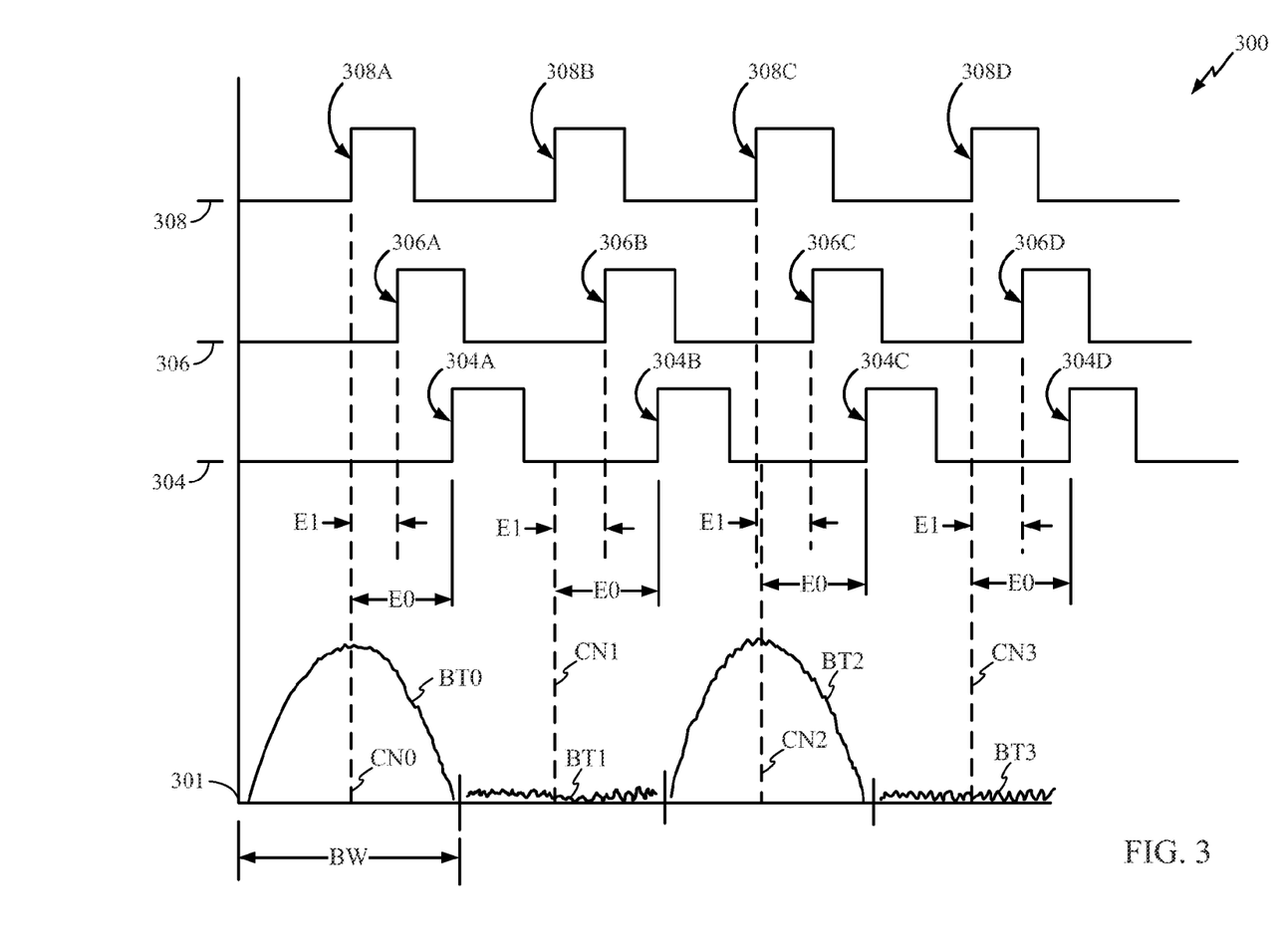
FIG. 3 is a timing diagram of an example control of sampling phase in a process according to one or more exemplary embodiments.

FIG. 3 shows one example timing 300 of one phase alignment process according to a phase selection aspect of various exemplary embodiments. Example operations corresponding to the timing 300 are described in reference to the FIG. 2 communication system 200, and with an example M=16 and an example R=4. Persons of ordinary skill in the art can readily adapt the FIG. 3 illustration of concepts to systems according to the exemplary embodiments using other values of M and R. Therefore, as previously described, the M-phase PLL 224 effectively outputs four sets of 4-phase sampling triggers ST, for triggering four phase shifted samplers 220. The FIG. 3 example 300 shows along a time axis 301 an example series of four bits as embodied in, or carried by a serial bit stream signal such as SD_RCV. The four example bits are labeled respectively as BT0, BT1, BT2, and BT3, and referenced generically as BTX. The example value of the bits BTX, "1010" is arbitrary. For purposes of describing concepts it will he assumed that these depicted values of the four bits BTX repeat for every iteration of changing the phase selector 226.

Referring still to FIG. 3, it will be understood that the depicted waveforms of the BTX bits are sufficient for describing an example phase alignment according to exemplary embodiments, but are not necessarily representative in detail of an actual waveform of an SD_RCV. As shown, all of the bits BTX have the same period T, which is the inverse of the bit rate SBPS. For purposes of phase reference, the centers of BT0, BT1, BT2, and BT3 are labeled CN0, CN1, CN2 and CN3, respectively. Also, for purposes of showing example iterations of controlling the phase selector 226, the centers CNX are referenced as the optimal sampling point. It will be understood that this is only an example optimal point for the phase shifted samplers 220 to respectively sample bits within SD_RCV. Persons of ordinary skill in the relevant arts can easily adapt the FIG. 3 timing, and illustration of concepts, to a phase alignment operation using other than the centers CNX as the optimal sampling point.

With continuing reference to FIG. 3, in one example initial state the phase selector 226 may select, from the 16 candidate sampling triggers STC, a first 4-phase sampling trigger ST is shown as selection 304. This first 4-phase sampling trigger includes a phase ST-1 at the edge 304A; an ST-2 at the edge 304B, an ST-3 at the edge 304C and a phase ST-4 at the edge 304D. Therefore, in accordance with the FIG. 2 communication system 200, edge 304A triggers a first phase shifted sampler 220-1; edge 304B triggers a second phase shifted sampler 220-2; edge 304C triggers a third phase shifted sampler 220-3; and edge 304D triggers a fourth phase shifted sampler 220-4. For purposes of reference, edges 304A, 304B, 304C and 304D may be assigned as being 0, 90, 180, and 270 degrees. As shown in FIG. 3, at this first selection 304 there is a phase difference E0 between the center of CN0 of bit BT0 and the rising edge 304A. It will be understood that since the remaining edges 304B, 304C and 304D are equally spaced, the same error E0 occurs in each of BT1, BT2 and BT3. In the FIG. 3 depicted example, it is assumed that E0 is determined unacceptable by the controller 230. Therefore, in this example, E0 causes the controller 230 to control the phase selector 226 to select a second 4-phase sampling trigger ST from the 16 candidate sampling triggers STC. The second 4-phase sampling trigger ST 306 comprises edges 306A, 306B, 306C and 306D, and is advanced (or could be delayed) in phase relative to the first 4-phase sampling trigger ST 304, by 22.5 degrees. The edges 306A, 306B, 306C and 306D therefore occur at −22.5, 67.5, 157.5, and 247.5 degrees, respectively, As depicted at FIG. 3, this second 4-phase sampling trigger ST produces an error E1.

Continuing with the above-described example phase alignment process in reference to FIG, 3, it will be assumed that E1, like E0, is determined unacceptable by the controller 230. The controller 230 therefore causes the phase selector 226 to select a third 4-phase sampling trigger ST 308 from the 16 candidate sampling triggers STC, advanced another 22.5 degrees. Referenced according to phases, the edges 308A, 308B, 308C and 308D will occur at −45, 45, 135, and 225 degrees, respectively. In the FIG. 3 example timing 300, this third 4-phase sampling trigger ST is substantially aligned with the bit centers CNX, and therefore produces an acceptably low error (not labeled).

Referring to FIGS, 2 and 3, it will be understood that an M value of 16 is only one example and that a higher value, such as 32, 64 or higher may be selected. As readily apparent, the higher the value of M relative to R the finer the granularity of adjusting the phase of the sampling triggers ST. Likewise, an R of four is only one example, and a higher value, such as eight, 16 or higher may be selected. As will also be readily apparent to persons of ordinary skill in the art, at higher values of R and M there may, depending on the bit rate SBPS of SD, be an increasing requirement to control jitter in the M-phase PLL 224, and in the received serial bit stream SD_RCV, as well as in the REF_CLK.

Figure 4:
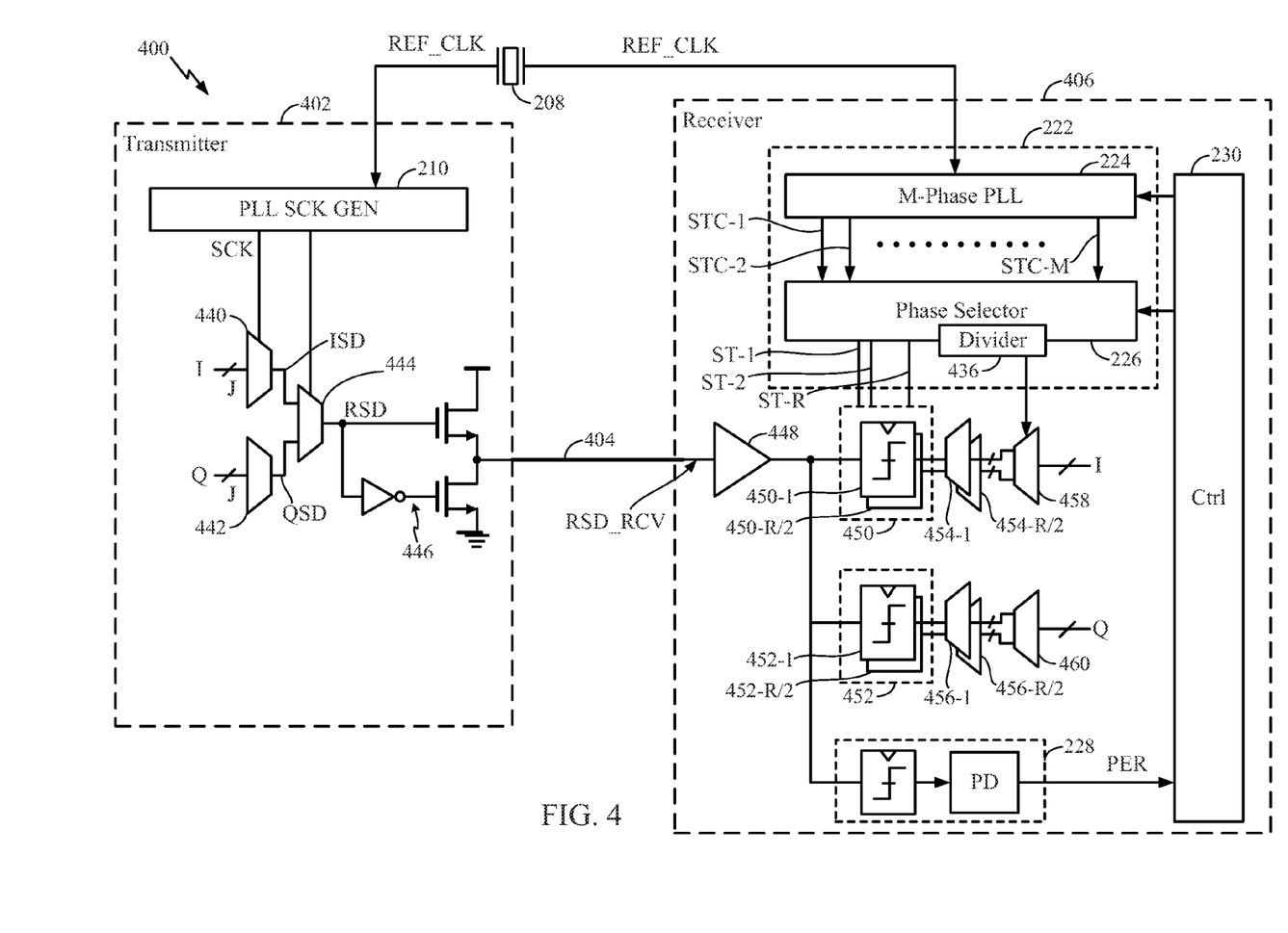
FIG. 4 is a functional block diagram of one example system for serial communication of J-bit in-phase (I) and quadrature (Q) data according to one or more exemplary embodiments.

FIG. 4 is a simplified functional block diagram of a phase sampling communication system 400 having operations similar to the FIG. 2 example system 200, with an alternative configuration for serializing, and communicating in-phase (I) and quadrature (Q) signals. To avoid, re-describing features and to better focus on aspects particular to the FIG. 4 phase sampling communication system 400 performing I-Q serialization and bit recovery, like blocks in relation to the FIG. 2 communication system 200 are given like numbering. It will be understood, however, that a block in FIG. 4 being numbered differently than a corresponding block in FIG. 2 does not necessarily mean different structure. For example, a block of FIG. 4 identical in structure and function to a corresponding block of FIG. 2 may he numbered differently to facilitate description of respectively different example operations.

Referring to FIG. 4, the phase sampling communication system 400 may have a serializer/transmitter 402 coupled to a receiver/data recovery unit 406 by a transmission line 404. The serializer/transmitter 402 may have an I-serializer 440 that receives J-bit I data, and a Q-serializer 442 that receives J-bit Q data. With respect to specific sources for the I data and the Q data, communication using I-Q encoding is known to persons or ordinary skill in the art and, therefore, further detailed description is omitted. With respect to clocking the I-serializer 440 and Q-serializer 442, one may use the rising edge of SCK from the reference clock generator 208 and the other may used the falling edge. Alternative clocking means may become apparent to persons of ordinary skill in the art upon view of this disclosure.

With continuing reference to FIG. 4, the i-serializer 440 may output a serial bit stream ISD and the Q-serializer 442 may likewise output a serial bit stream QSD, and each of ISD and QSD may be input to a 2:1 multiplexer 444. The 2:1 multiplexer 444 may interleave ISD and QSD in a bit alternating manner, and output a merged serial bit stream RSD. The total bit rate RBPS of RSD is therefore equal to 2 times SCK. With respect to specific structure and operation, the 2:1 multiplexer 444 may be in accordance with conventional circuitry for bit alternating bit time-division multiplexing of two bit streams.

With continuing reference to FIG. 4, the serial bit stream RSD may feed a line driver or buffer 446 that drives the serial data transmission line 404 extending to a buffer 448 of the receiver/data recovery unit 406 according to one or more of the exemplary embodiments. The buffer 448 may receive the transmitted RSD as RSD_RCV, which may have phase delay and degradation in S/N compared to RSD. The buffer 448 may then feed RSD_RSC to a bank of R/2 phase shifted I-phase samplers 450-1 . . . 450-R/2 (collectively "phase shifted I-phase samplers 450") and, concurrently, to a bank of phase shifted Q-phase samplers 452-1 . . . 452-R/2 (collectively "phase shifted Q-phase samplers 452"). The R/2 phase shifted I-phase samplers 450-1 . . . 450-R/2 and R/2 phase shifted Q-phase samplers 452-1 . . . 452-R/2 may be structurally identical to one another, and may be structurally identical to the phase shifted samplers 220-j of the FIG. 2 phased serial communication system 200.

In one aspect, one alternating sequence of the R phases of ST generated by the R-phase sampling trigger generator 222 may be assigned as "odd." The other alternating sequence of R phases of ST may be assigned as "even." As illustration, odd phases may be ST-1, ST-3 and even phases may be ST-2, ST-4. It will be understood that the naming as to which alternating sequence is named "odd" and which is named "even" is arbitrary. Further to this aspect, each of the odd phases of ST may control a corresponding one of the R/2 phase shifted I-phase samplers 450-1 . . . 450-R/2. Each of the even sampling phases of ST may control a corresponding one of the R/2 phase shifted Q-phase samplers 452-1 . . . 452-R/2. Continuing with this example assignment of "odd" and "even," the sampling phase ST-1 (the first odd phase of the R-phase sampling trigger ST) may trigger the first phase shifted 1-phase sampler 454-1, followed by phase ST-2 (the first even phase of the R-phase sampling trigger ST) triggering the second phase shifted Q-phase sampler 452-1. Next, phase ST-3 (the second odd phase of the R-phase sampling trigger ST) may trigger a second phase shifted 1-phase sampler (not separately shown on FIG. 4), followed by phase ST-4 triggering the second phase shifted Q-phase sampler (not separately shown on FIG. 4), and so on in the same alternating odd-even sequence. As will be understood, if the I and Q bits within CSD-RCV are phase aligned with "odd" and "even" phases of the R-phase sampling trigger ST, each cycle of ST results in the R/2 phase shifted I-phase samplers 450 capturing a sequence of R12 1-bits, and the R/2 phase shifted Q-phase samplers 452 capturing a sequence of R/2 of the Q-bits.

With continuing reference to FIG. 4, each of the R/2 phase shifted I-phase samplers 450-1 . . . 450-R/2 may feed a corresponding latch 454-1 . . . 454-R/2. Likewise, each of the R/2 phase shifted Q-phase samplers 452-1 . . . 452-R/2 may feed a corresponding latch 456-1 . . . 456-R/2. Each of the latches 454-1 . . . 454-R/2 and each of the latches 456-1 . . . 456-R/2 may be clocked, by the same rising edge of its phase ST-j that triggers its corresponding phase shifted sampler, similar to the clocking of latches 232 described in reference to FIG. 2.

As one example, (assuming the R sampling phases of ST are aligned odd-even with the I-Q bits in RSD_RCV), in one such operation at sampling phase ST-1 the first phase shifted I-phase sampler 450-1 captures a new I-bit value of SD_RCV and, concurrently, the latch 454-1 latches the previously captured I-bit bit value SD_RCB from that first phase shifted I-phase sampler 450-1. Likewise, at sampling phase ST-2 the first phase shifted Q-phase sampler 452-1 captures a new Q-phase bit value of SD_RCV and, concurrently, the latch 456-1 latches the previously captured in-phase bit value SD_RCB from that first phase shifted Q-phase sampler 456-1.

Referring still to FIG. 4, in one aspect the latches 454-1 . . . 454-R may sequentially feed a J-bit serial-in-parallel-out I-register 458. Likewise, the latches 456-1. . . . 456-R/2 may sequentially feed a J-bit serial-in-parallel-out Q-register 460. A divide by J/R divider 436 may, every J/R complete cycle of ST, clock the parallel output port (shown but separately numbered) of the J-bit serial-in-parallel-out I-register 458. The J/R divider 436 may, similarly, clock the parallel output port (shown but separately numbered) of the J-bit serial-in-parallel-out Q-register 460.

As one example of one recovery of I and Q bits according to the exemplary embodiments on a system such as the phase sampling communication system 400, assume R=4, and assume an example first and second (not specifically shown) phase shifted I-phase samplers 450 and an example first and second (not specifically shown) phase shifted Q-phase samplers 452. Further assume every ST cycle consists of four clock phases, namely ST-1, ST-2, ST-3, ST-4, ST-1, ST-2 and on forth, with ST-1 and ST-3 respectively triggering the example first and second I-phase samplers 450, and ST-2 and ST-4 respectively triggering the example first and second phase-shifted Q samplers. In this example, every ST cycle may produce at the outputs of the first and second I-phase samplers 450 a block of two consecutive bits of I data, and at the outputs of the first and second Q-phase samplers 452 a block of two consecutive bits of Q data. As a further example, assume the I data and the Q data are 8-bit data and, therefore, the serial-in-parallel-out I-register 458 and serial-in-parallel-out Q-register 460 are each 8 bits. Setting the J/R divider 436 at 2J/R=2*8/4=¼, (because there are only 4/2 or 2 I-phase samplers 450 and 2 R/2 Q-phase samplers), means that every 4 ST cycles the parallel output port (shown but separately numbered) of the 8-bit serial-in-parallel-out I-register 458 and the parallel output port (shown but separately numbered) (shown Q-register 460 may be clocked to generate an 8-bit I data and an 8-bit Q-data.

With respect to phase alignment of ST with the bits of RSD_RSC, the phase error detector 228 and controller 230 described in reference to FIG. 2 may be employed, using a process such as described in reference to FIG. 3.

With respect to phase alignment of the "odd" phases and "even" phases of the R-phase sampling trigger ST relative to the 1 phase and the Q phase of the RSD_RSC bits, detection and correction will be described in order. Detecting of I-Q phase alignment may be according to conventional I-Q serial hit stream receivers that sample the I and the Q bits using SCK (Le., as shown in the Related Art FIG. 1) received from the transmitter. Such means are known to persons of ordinary skill in the art, and therefore further detailed description is omitted. With respect to correction, the detected I-Q phase alignment may be input to the controller 230 and, in response, the controller 230 may control the phase selector 226 to switch the selection, for example by plus or minus pie (i.e., to rotate the R-phase sampling trigger ST by 180 degrees).

As will be apparent to persons of ordinary skill in the art from this disclosure, a phase sampling communication system according to one or more exemplary embodiments may encompass, and be arranged to be readily changeable or switchable in configuration to perform methods described in reference to either of FIG. 2 or FIG. 4.

Figure 5:
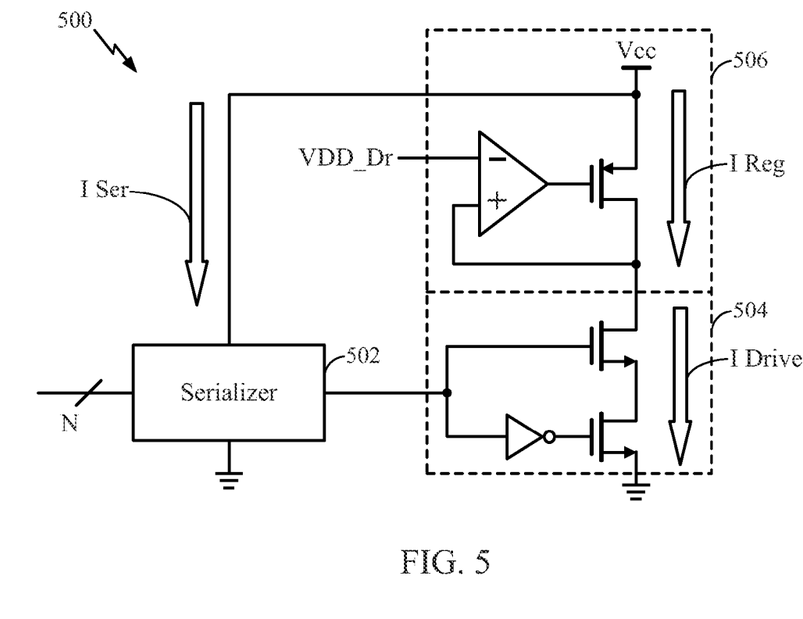
FIG. 5 is a simplified schematic of a serializer circuit for a serial communication system or method according to one or more exemplary embodiments.

FIG. 5 shows one example serializer/driver 500 to perform functions of serializing data and driving a transmission line according to the serialized data. The FIG. 5 example serializer/driver 500 may implement functions of the serializer unit 214 and the line driver 218 in the serializer/transmitter 202 of the FIG. 2 serializing and phased sampling communication system 200. Likewise, the FIG. 5 example serializer/driver 500 may implement functions of the I-serializer 440 and the Q-serializer 442, as well as the line driver or buffer 446 of the I-Q serializer/transmitter 402 of the FIG. 4 I-Q serializing and phased sampling communication system 400.

Referring to FIG. 5, the serializer/driver 500 comprises a serializer section 502 that receives multi-bit data (e.g., the N-bit data flow PD generated by the data source 212 shown in FIG. 2) to a serial hit stream feeding a FET-based line driver circuit 504 and a DC-DC regulator 506 that drops the Vcc main power supply voltage to a drive voltage VDD_Dr specified for the transmitted bit stream. The DC-DC regulator 506 may comprise a difference amplifier (shown but not separately numbered) in the depicted arrangement. As readily seen, power consumption by the serializer/driver 500 is Vcc multiplied by a total current I Total. The current I Total consists of the current I Reg that flows from the Vcc power supply into the current input (not separately numbered) of the DC-DC regulator 506 and our from the current output (shown but not separately numbered) of the DC-DC regulator 506, added to the current I Ser flowing to the serializer section 502. The current I Reg, after flowing through the DC-DC regulator 506, becomes the current I Drive going to the line driver FETs 504. The current I Ser, after passing through the serializer section 502, flows to ground.

To illustrate a power consumption of the FIG. 5 serializer/driver 500, an example I Drive current of approximately 560 microamps will he assumed, as this corresponds to one example type of serial bit stream transmission line that may be used in contemplated applications of the disclosed embodiments. An example I Ser current of approximately 300 microamps will also be assumed, corresponding to conventional parallel-to-serial devices. Therefore, using these example currents for I Ser and I Drive, a power consumption of a device according to the FIG. 5 serializer/driver 500 may be 300 microamps added to 560 microamps, which equals 860 microamps, multiplied by Vcc.

Figure 6:
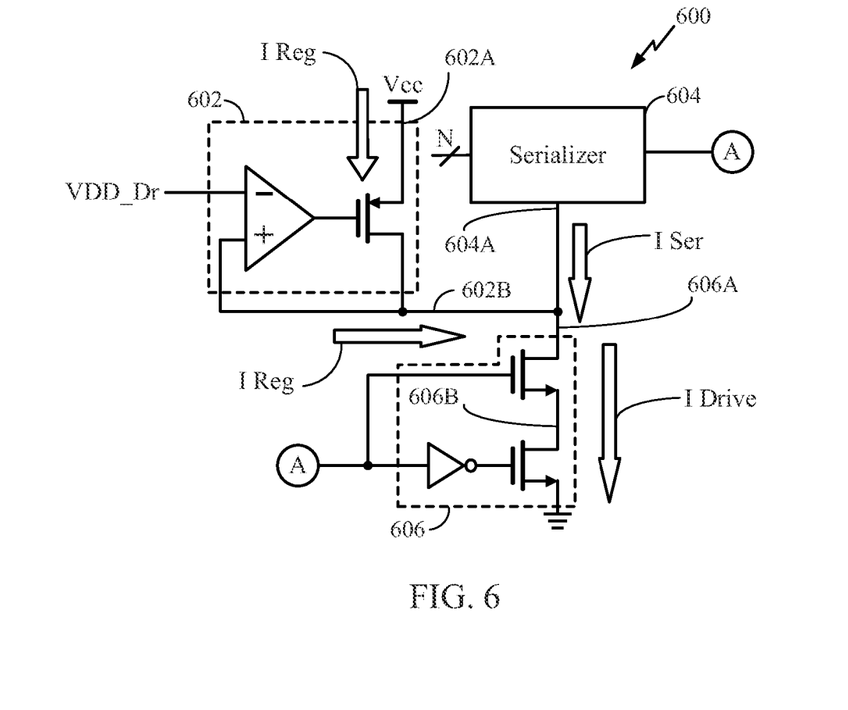
FIG. 6 is a simplified schematic of a shared current serializer according to one aspect of a serial communication system and method according to one or more exemplary embodiments.

FIG. 6 is a block schematic of a current sharing serializer/driver 600 according to one or more aspects of various exemplary embodiments, and is one alternative to the FIG. 5 serializer/driver 500 previously described. The current sharing serializer/driver 600 comprises a DC-DC regulator 602 having a current input terminal 602A coupled to the Vcc power supply that drops the voltage on its current output terminal 602B to the drive voltage VDD, in a parallel arrangement with a serializer 604 having an input terminal 604A that may be coupled to the Vcc power supply, and an output terminal 604B. Both the current output terminal 602B of the DC-DC regulator 602 and the output terminal 604B of the serializer 604 feed a line driver current input terminal 606A of a FET-based line driver circuit 606, the line driver circuit 606 having a line driver output terminal 606B for coupling to a transmission line (not shown). As will be readily seen by persons of ordinary skill in the art, the FIG. 6 current sharing serializer/driver 600 according to the various exemplary embodiments performs the same functions as performed by the FIG. 5 serializer/driver 500, but may consume considerably less power.

Referring still to FIG. 6, the benefit of a considerably lower power is obtained by its arrangement of the serializer 604 to re-use the current I Ser, as part of the drive current I Drive, instead of flowing to ground as done by I Ser after leaving the serializer 502 in the FIG. 5 serializer/driver 500. The total current consumed by the current sharing serializer/driver 600 is therefore the same as the drive current I Drive, instead of the current I Drive added to the serializer current I Ser as was consumed by the FIG. 5 serializer/driver 500. Assuming FIG. 6 has the same line current I Drive of 560 microamps used for the above-described example in reference to FIG. 5, and the same serializer current I Ser of 300 microamps, the potential savings is 300 microamps. In other words, the FIG. 6 current sharing serializer/driver 600, in this example, may require only 560/860 or approximately 65% of the power required by the FIG. 5 serializer/driver 500.

Figure 7:
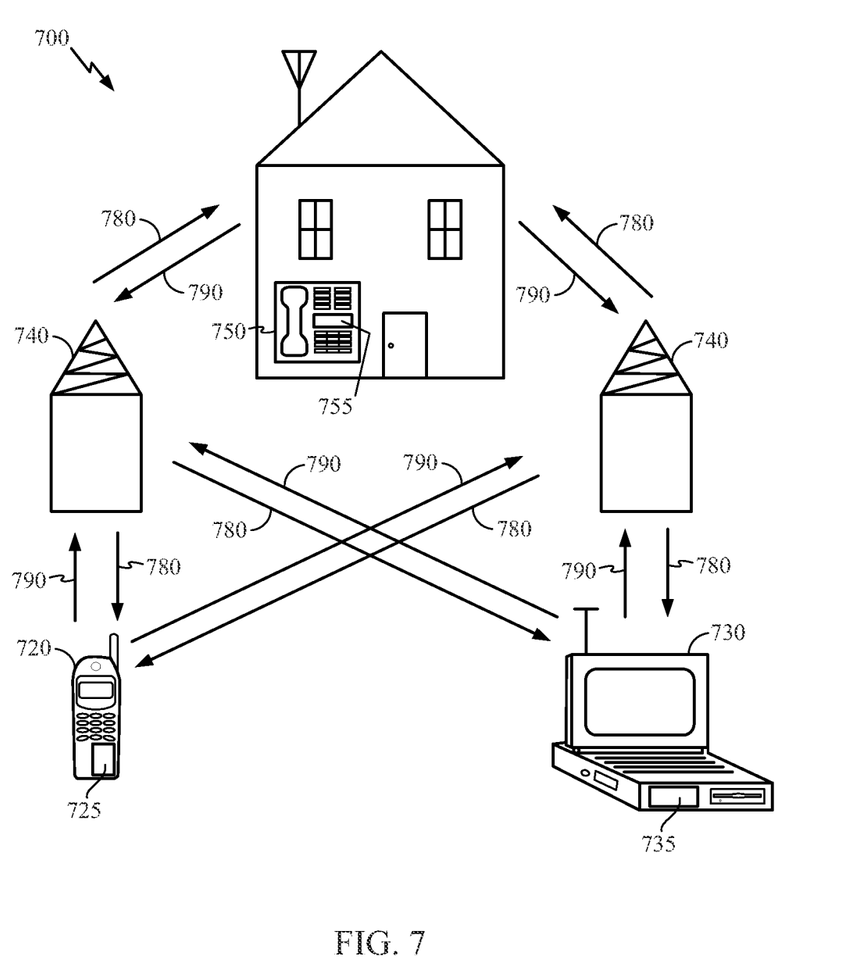
FIG. 7 is a functional block diagram of example personal computing devices according to one or more exemplary embodiments.

FIG. 7 illustrates an exemplary wireless communication system 700 in which one or more embodiments of the disclosure may be advantageously employed. For purposes of illustration, FIG. 7 shows three remote units 720, 730, and 750 and two base stations 740. It will be recognized that conventional wireless communication systems may have many more remote units and base stations. The remote units 720, 730, and 750 include semiconductor devices 725, 735 and 755 (including on-chip voltage regulators, as disclosed herein), which are among embodiments of the disclosure as discussed further below. FIG. 7 shows forward link signals 780 from the base stations 740 and the remote units 720, 730, and 750 and reverse link signals 790 from the remote units 720, 730, and 750 to the base stations 740.

In FIG. 7, the remote unit 720 is shown as a mobile telephone, the remote unit 730 is shown as a portable computer, and the remote unit 750 is shown as a fixed location remote unit in a wireless local loop system. For example, the remote unit may be one or more of a mobile phone, hand-held personal communication systems (PCS) unit, portable data units such as a personal data assistant, navigation devices (such as GPS enabled devices), set top box, music player, video player, entertainment unit, fixed location data unit such as a meter reading equipment, or any other device that stores or retrieves data or computer instructions, or any combination thereof. Although FIG. 7 illustrates remote units according to the teachings of the disclosure, the disclosure is not limited to these exemplary illustrated units. Embodiments of the disclosure may be suitably employed in any device which includes at least one semiconductor die having active integrated circuitry including memory and on-chip circuitry for test and characterization.

Those of skill in the art will appreciate that information and signals may be represented using any of a variety different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory. EEPROM memory, registers, hard disk, a removable disk, a CD-ROM, or any other form of storage medium known in the art. An exemplary storage medium is coupled to the processor such that the processor can read information from, and write information to the storage medium. In the alternative, the storage medium may be integral to the processor.

Accordingly, an embodiment of the invention can include a computer readable media embodying a method for phase sampling a received serial bit stream as according to methods of described embodiments. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not he performed in any particular order. Furthermore, although elements of the invention may be described or claimed in the singular, the plural is contemplated unless limitation to the singular is explicitly stated.

What is claimed is:

1. A method for recovering bits from a serial bit stream signal having a given bit rate, comprising:
   receiving the serial bit stream signal concurrently at R different phase shifted samplers, where R is at least two;
   generating an M-phase signal, wherein M is at least an integer multiple of R, comprising M/R candidate sets of R phases, each candidate set of R phases comprising R phases equally spaced according to the inverse of the bit rate,
   selecting one of the M/R candidate sets of R phases as a selected R-phase sampling trigger comprising R consecutive trigger phases equally spaced according to the inverse of the bit rate;
   triggering the R phase shifted samplers, one at a time, each at a sampling time corresponding to one among the R consecutive trigger phases of the selected R-phase sampling trigger, to obtain at the R phase shifted samplers a block of R consecutive bits of the serial bit stream signal; and
   adjusting a phase of the R-phase sampling trigger relative to the serial bit stream by selecting another of the M/R candidate sets of R phases as the selected R-phase sampling trigger.

2. The method of claim 1, wherein the serial bit stream signal carries N-bit data, and the method further comprises repeating said triggering the R phase shifted samplers and, at each repeat, recovering another block of R bits of the N-bit data until N parallel bits are obtained.

3. The method of claim 1, further comprising detecting a phase difference between the R-phase sampling trigger and the serial bit stream signal, and wherein said selecting the another of the M/R candidate sets of R phases as the selected R-phase sampling trigger is based on a result of said detecting a phase difference.

4. The method of claim 1, wherein each triggering of each phase shifted sampler includes causing the phase shifted sampler to generate at its output a sampled binary output having a value of "0" or "1" that indicates a comparative value at the corresponding sampling time among the R consecutive sampling times of the serial bit stream signal relative to a given binary decision threshold.

5. The method of claim 1, wherein said serial bit stream signal comprises bits of a first signal and a second signal, in an alternating sequence, and wherein said triggering the R phase shifted samplers obtains at a first plurality of the R phase shifted samplers a block of a first plurality of consecutive bits of the first signal and obtains at a second plurality of the R phase shifted samplers a block of a second plurality of consecutive bits of the second signal.

6. The method of claim 5, wherein the consecutive sampling times alternate in sequence between even sampling times and odd sampling times, and each of the first plurality of the R phase shifted samplers is triggered at a corresponding one of the even sampling times and each of the second plurality of the R phase shifted samplers is triggered at a corresponding one of the odd sampling times.

7. The method of claim 6, wherein the first signal corresponds to an in-phase (I) signal and the second signal corresponds to a quadrature (Q) signal.

8. The method of claim 6, wherein said serial bit stream signal carries alternating I and Q bits of a J-bit I data and a J-bit Q data, respectively, and wherein said repeating is repeated at least J/2R repetitions to recover the J-bit I data and the J-bit Q data.

9. The method of claim 8, wherein each triggering of each phase shifted sampler includes causing the phase shifted sampler to generate at its output a sampled binary output having a value of "0" or "1" that indicates a comparative value, at the corresponding sampling time among the consecutive sampling times, of the serial bit stream signal relative to a given binary decision threshold,
   wherein R is four, and
   wherein each repetition obtains at the first plurality of phase shifted samplers a block of two consecutive bits of the J-bit I data and at the second plurality of phase shifted samplers a block of two consecutive bits of the J-bit Q data.

10. An apparatus for recovering bits from a serial bit stream signal having a given bit rate, comprising:
    R different phase shifted samplers for concurrently receiving the serial bit stream signal;
    means for generating an M-phase signal, wherein M is at least an integer multiple of R, comprising M/R candidate sets of R phases, each candidate set of R phases comprising R phases equally spaced according to the inverse of the bit rate,
    means for selecting one of the M/R candidate sets of R phases as a selected R-phase sampling trigger comprising R consecutive trigger phases equally spaced according to the inverse of the bit rate; and
    means for triggering the R phase shifted samplers, one at a time, at each at a sampling time corresponding to one among the R consecutive trigger phases of the selected R-phase sampling, to obtain at the R phase shifted samplers a block of R consecutive bits of the serial bit stream signal,
    wherein the means for selecting is configured to adjust a phase of the R-phase sampling trigger relative to the serial bit stream by selecting another of the M/R candidate sets of R phases as the selected R-phase sampling trigger.

11. The apparatus of claim 10, further comprising means for detecting a phase difference between the R-phase sampling trigger and the serial bit stream signal, and wherein said means for selecting one of the M/R sets of R phases set is further configured to select the another of the M/R candidate sets as the selected the R-phase sampling trigger based on a result of said detecting a phase difference.

12. The apparatus of claim 10, wherein the apparatus is integrated in at least one semiconductor die.

13. The apparatus of claim 10, further comprising a device, selected from the group consisting of a set top box, music player, video player, entertainment unit, navigation device, communications device, personal digital assistant (PDA), fixed location data unit, and a computer, into which the apparatus is integrated.

14. An apparatus for recovering bits from a serial bit stream signal having a given bit rate, comprising:
   a serial bit stream receiver having an input and an output;
   a plurality of R different phase shifted samplers, each having a signal input coupled to the output of the serial bit stream receiver, and each having a triggering input;
   an M-phase signal generator, wherein M is at least an integer multiple of R, configured to generate M/R candidate sets of R phases, each candidate set of R phases comprising R phases equally spaced according to the inverse of the bit rate;
   a phase selector, configured to select one of the M/R candidate sets of R phases as a selected R-phase sampling trigger having R consecutive trigger phases equally spaced according to the inverse of the bit rate; and
   R phase taps coupled to the phase selector, each phase tap configured to output a corresponding one of the R consecutive equally spaced triggering phases of the selected R-phase sampling trigger, and each phase tap coupled to a corresponding one of the R phase shifted samplers,
   wherein the phase selector is configured to adjust a phase of the R-phase sampling trigger relative to the serial bit stream by selecting another of the M/R candidate sets of R phases as the selected R-phase sampling trigger.

15. The apparatus of claim 14, further comprising a phase error detector configured to receive a reference phase corresponding to one or more of the R equally spaced triggering phases and coupled to the output of the serial bit stream receiver, configured to generate a phase error signal indicating a phase difference between the reference phase and the serial bit stream signal, and wherein said R-phase sampling trigger generator is configured to select the another of the M/R sets of the R equally spaced phases based on said phase error signal.

16. The apparatus of claim 14, wherein each phase shifted sampler is configured to output, in response to a given triggering signal, a sampled binary output having a value of "0" or "1" that indicates a comparative value, at the phase shifter sampler's corresponding sampling time, of the serial bit stream signal relative to a given binary decision threshold.

17. The apparatus of claim 14, wherein the apparatus is integrated in at least one semiconductor die.

18. The apparatus of claim 14, further comprising a device, selected from the group consisting of a set top box, music player, video player, entertainment unit, navigation device, communications device, personal digital assistant (PDA), fixed location data unit, and a computer, into which the apparatus is integrated.

19. A serial bit transmitter comprising:
   a serializer having a parallel data input, a serial bit output, a current input terminal coupled to a power supply and having a current output terminal;
   a DC-DC regulator having a current input terminal coupled to the power supply and a current output terminal coupled to the current output terminal of the serializer;
   a line driver circuit having a serial bit input coupled to the serial bit output terminal of the serializer and having a line driver current input terminal coupled to the current output terminal of the serializer, and a line driver output terminal for outputting a line drive current to an external transmission line,
   wherein a total current delivered by the line driver circuit is the sum of a current from the current output terminal of the serializer and a current from the current output terminal of the DC-DC regulator, and
   wherein the total current is the line drive current.

20. A method for recovering bits from a serial bit stream signal having a given bit rate, comprising:
   step for receiving the serial bit stream signal concurrently at R different phase shifted samplers, where R is at least two;
   step for generating an M-phase signal, wherein M is at least an integer multiple of R, comprising M/R candidate sets of R phases, each candidate set of R phases comprising R phases equally spaced according to the inverse of the bit rate,
   step for selecting one of the M/R candidate sets of R phases as a selected R-phase sampling trigger comprising R consecutive trigger phases equally spaced according to the inverse of the bit rate;
   step for triggering the R phase shifted samplers, one at a time, each at a sampling time corresponding to one among the R consecutive trigger phases of the selected R-phase sampling trigger, to obtain at the R phase shifted samplers a block of R consecutive bits of the serial bit stream signal; and
   step for adjusting a phase of the R-phase sampling trigger relative to the serial bit stream, wherein the adjusting comprises repeating the step for selecting, to select another of the M/R candidate sets of R phases as another selected R-phase sampling trigger, and repeating the step of triggering based on the another selected R-phase sampling trigger.

21. The method of claim 20, further comprising step for detecting a phase difference between the R-phase sampling trigger and the serial bit stream signal, and wherein said step for adjusting selects another of the M/R candidate sets of phases based on a result of said detecting a phase difference.

* * * * *